(12) United States Patent
Biggs et al.

(10) Patent No.: US 10,976,377 B2
(45) Date of Patent: Apr. 13, 2021

(54) CONNECTION DETECTION BASED ON CABLE CAPACITANCE

(71) Applicant: OpenPath Security Inc., Culver City, CA (US)

(72) Inventors: Michael Biggs, Culver City, CA (US); Samy Kamkar, Los Angeles, CA (US); Alexander A. Kazerani, Santa Monica, CA (US)

(73) Assignee: OPENPATH SECURITY INC., Culver City, CA (US)

( * ) Notice: Subject to any disclaimer, the term of this patent is extended or adjusted under 35 U.S.C. 154(b) by 99 days.

(21) Appl. No.: 16/540,206

(22) Filed: Aug. 14, 2019

(65) Prior Publication Data

US 2021/0048468 A1 Feb. 18, 2021

(51) Int. Cl.
*G01R 27/26* (2006.01)
*G01R 31/69* (2020.01)
*G01R 1/20* (2006.01)

(52) U.S. Cl.
CPC ............. *G01R 31/69* (2020.01); *G01R 1/203* (2013.01); *G01R 27/2605* (2013.01)

(58) Field of Classification Search
None
See application file for complete search history.

(56) References Cited

U.S. PATENT DOCUMENTS

| 2003/0146763 A1* | 8/2003 | Sunter | G01R 31/31855 324/527 |
| 2010/0073560 A1* | 3/2010 | Kitano | H04N 5/44513 348/554 |
| 2019/0195934 A1* | 6/2019 | Chou | G01R 31/67 |

* cited by examiner

*Primary Examiner* — Jas A Sanghera
(74) *Attorney, Agent, or Firm* — Ansari Katiraei LLP; Arman Katiraei; Sadiq Ansari

(57) ABSTRACT

A device may include a wire interface (e.g., port), a detection circuit and a microcontroller. The detection circuit may include a resistor, a comparator, and wiring connecting the resistor to the wire interface and to a first input of the comparator. The microcontroller may provide a test signal to the resistor, and a threshold signal to a second input of the comparator. The test signal passes through the resistor and continues to the wire connector and the comparator first input with little to no change or attenuation when the wire interface is disconnected, but is attenuated when the wire interface is connected to a wire with capacitance charging and discharging based on the test signal. The comparator may compare the voltage of a resulting signal at the wire interface to the threshold signal voltage, and depending on the comparison may detect if a wire is connected to the wire interface.

17 Claims, 9 Drawing Sheets

CONNECTION DETECTION BASED ON CABLE CAPACITANCE

BACKGROUND ART

Remotely controlled systems, cloud-based systems, and/or other systems may include equipment or devices that are installed on the customer's premises. The system provider may use third-party installers to install the on-premises equipment or devices. Once the equipment is installed and operational, the system provider may remotely administer, control, and/or monitor the equipment and associated system without a physical presence at the customer's premises.

The third-party installers, and even the system provider's own personnel, may incorrectly connect or wire the equipment or may omit certain steps in the installation process that lead to a misconfiguration or improper setup of the system. The on-site installer as well as the remote system provider may be unable to detect some of these errors when there is no active or live signaling between two devices connected by a common cable. For instance, a first device may be unable to detect if a cable is connected to a particular port of the first device if the opposite end of the cable is not connected to a second device, the cable is connected but the second device is powered off, the cable is connected but the second device has a switch that is in a default or normally open state, or the cable is connected but the second device does not provide signaling over the cable.

DETAILED DESCRIPTION

The following detailed description refers to the accompanying drawings. The same reference numbers in different drawings may identify the same or similar elements.

Systems and methods, as provided herein, detect a cable that is connected to specific port and/or wire connector of a device based on the capacitance of the cable even when no electrical signaling is provided from an opposite end of the cable. In particular, the systems and methods provide cable detection circuitry for detecting the presence or absence of a cable connected to the specific port and/or wire connector when the opposite end of the cable is not connected to another device, or is connected to an open switch, sensor, or a different second device that is powered off or otherwise does not provide signaling from the opposite end of the cable when in a default or inactive state.

An example implementation involves using the cable detection circuitry disclosed here as part of an access control system. The access control system may include an access control unit ("ACU"). The ACU may authorize user access to different secured resources of the access control system, and may remotely control access to the secured resources via signaling that is provided to the secured resources or devices associated with the secured resources. The ACU may have multiple ports, and each port may be connected, via long-runs of cabling or wiring, to a different sensor, circuit, device, or secured resource of the access control system. In this example, an installer may use the cable detection circuitry to verify that cables have been connected to a correct or expected set of the ACU ports even when there is no live or active signaling coming from an opposite end of the cables. Also, a remote access control system administrator may use the cable detection circuitry to remotely verify that the ports of the ACU are correctly connected and remain connected to devices controlled by the ACU even when these connected devices have an open switch, are powered off, or otherwise do not provide live or active signaling from the opposite end of the connected cable.

The cable detection circuitry set forth herein may be used in conjunction with other systems and devices where the detection of cables or wiring at different ports or wire connectors is desired. The cable detection circuitry may be implemented using existing components of a device, or may be implemented with minimal modification to the device, device ports, and/or device wire connectors.

Figure 1:
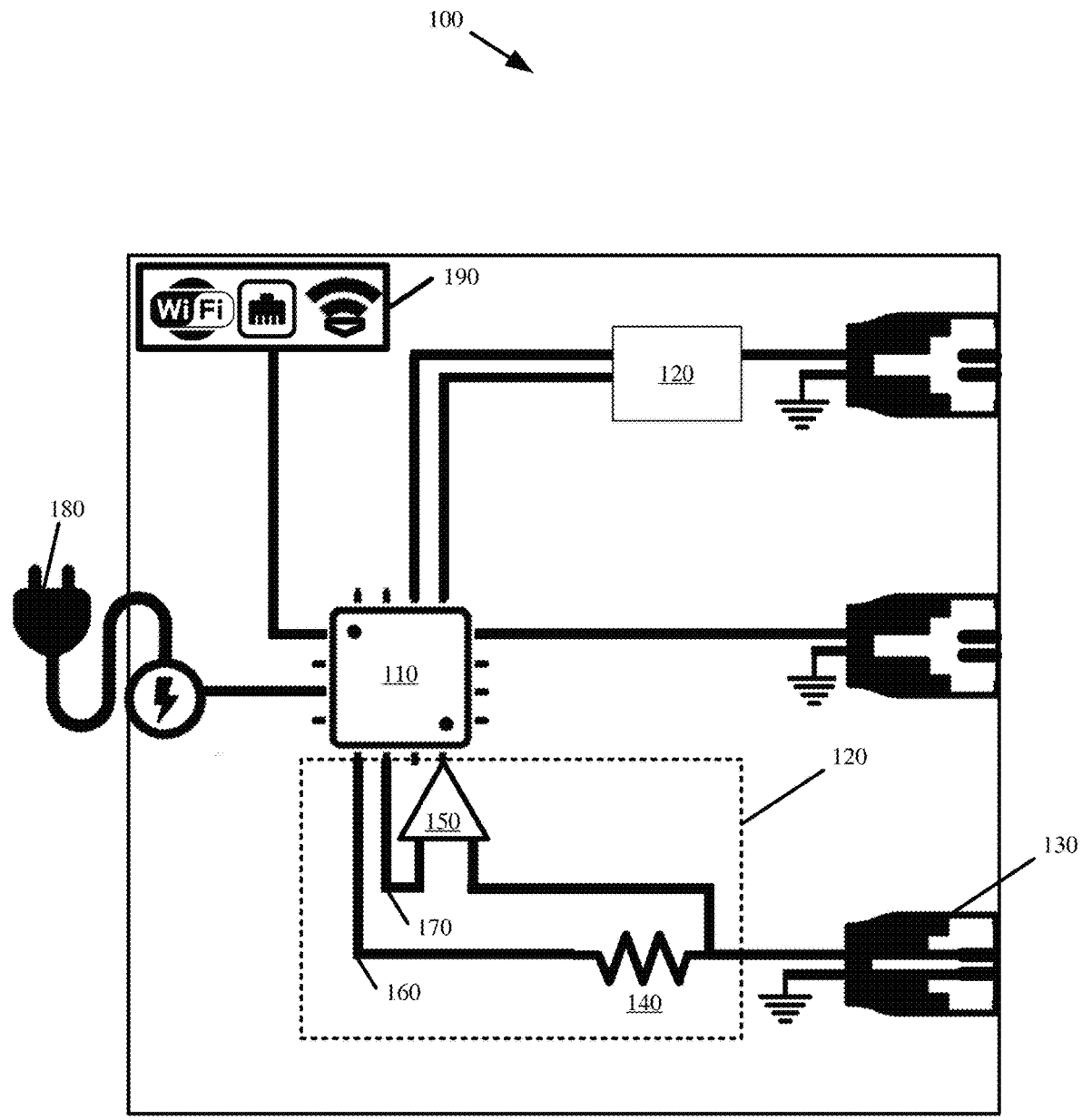
FIG. 1 illustrates an example device incorporating cable detection circuitry in accordance with some embodiments presented herein.

FIG. 1 illustrates example device 100 incorporating the cable detection circuitry in accordance with some embodiments presented herein. The cable detection circuitry may include microcontroller 110 with circuit 120, and may be used to detect the presence or absence of a cable connected to port 130 of device 100. Device 100 may have additional ports for connecting to other devices, and additional instances of circuit 120 may be used in conjunction with microcontroller 110 to detect the presence or absence of a cable connected to these other ports of device 100. Additional instances of circuit 120 may also be used to detect the presence or absence of wires connected to different pins or wire connectors of port 130.

In some embodiments, microcontroller 110 may be a processor or control module of device 100. Microcontroller 110 may output a test signal and one or more reference threshold signals that pass through circuit 120, and may receive output from circuit 120 to determine if a cable is connected to port 130. Microcontroller 110 may control each circuit 120 of device 100 independently in order to verify cable connectivity at different ports or wire connectivity at different pins or wire connectors of the same port. In some embodiments, microcontroller 110 may have direct communication pathways to port 130 and/or other ports of device 100, which bypass circuit 120. Through the direct communication pathways, microcontroller 110 may transmit and receive signaling over connected cables without interference from circuit 120. In other words, microcontroller 110 may be used with circuit 120 for capacitance-based cable detection as disclosed herein, and may be used without circuit 120 for communication with one or more devices that are connected to ports of device 100 and/or for communication with other devices that are accessible via other wired or wireless networks.

Circuit 120 may include resistor 140, comparator 150, and one or more wires that connect circuit 120 to microcontroller 110 and port 130. Resistor 140 may be connected to test signal output 160 of microcontroller 110, and to a particular pin or wire connector of port 130. The particular pin or wire connector may also connect to a first input of comparator 150 in order to provide the resulting signal from the particular pin or wire connector of port 130 to the first input of comparator 150. A second input of comparator 150 may be connected to reference threshold signal output 170 of microcontroller 110.

Elements of circuit 120 may be included within microcontroller 110, including, but not limited to, comparator 150. Resistor 140 may be replaced by circuitry which generates a known current under the control of microcontroller 110, and which may be included in microcontroller 110. Conversely, the reference threshold signal output 170 may be generated by circuitry external to microcontroller 110, under the control of microcontroller 110.

Microcontroller 110 may output a test signal at a particular voltage and frequency via test signal output 160, and may simultaneously output a changing reference threshold signal for comparator 150 via reference threshold signal output 170. Circuit 120, in conjunction with microcontroller 110, may use the test signal and the one or more reference threshold signals to detect the presence or absence of a cable connected to port 130. For instance, and as will be described in further detail below, comparator 150 may compare the reference threshold signal voltage against the voltage of the resulting signal on the particular pin or wire connector of port 130 to determine if the test signal is attenuated due to capacitance of a cable that is connected to port 130, and more specifically, that is connected to the particular pin or wire connector.

Resistor 140 may be selected according to the expected range of capacitance values for the cables and the desired nominal frequency of the test signal. The frequency of the test signal may be modified by microcontroller 110 to allow for a wider range of capacitance values, and therefore a wider range of cable types and cable lengths.

Port 130 may be a cable or wire connection interface that can communicably couple device 100 to another device via a cable or one or more wires connected to port 130 and a corresponding port or interface of the other device. Port 130 may include one or more pins or wire connectors. In some embodiments, a cable may be plugged into port 130, with the cable connector aligning one or more wires of the cable with one or more pins or wire connectors of port 130. In some other embodiments, each individual wire may be screwed, clamped, or otherwise secured to a single wire connector of port 130.

At least a first pin or first wire connector of port 130 may be used to pass signaling over a connected cable or wire. The first pin or first wire connector may connect to resistor 140 and may be used to pass the test signal from test signal output 160 through the first pin or first wire connector. The first pin or first wire connector may also be connected to another circuit of device 100 or another internal wire that runs to a different pin of microcontroller 110 so that the first pin or first wire connector can be used to transmit power or data over a connected cable when circuit 120 is not being used to detect whether a cable is connected to port 130. In some embodiments, a second pin or second wire connector of port 130 may be connected to ground or otherwise used to complete a circuit with another connected device. As noted above, port 130 may have additional pins or wire connectors for use with cables having multiple sets of wires.

In some embodiments, device 100 may be a circuit board that is integrated with or coupled to other components of an ACU or other device. For instance, device 100 may connect to internal or external power supply 180. Power supply 180 may power device 100, and may provide the electricity needed to operate microcontroller 110 and circuit 120 for the detection of a cable that is connected to port 130 and/or other ports of device 110 based on the capacitance of the cable even when no electrical signaling is provided from an opposite end of the cable. Device 100 may also include network interface 190 for communicating with a device of a remote system administrator, installer, or other user. Network interface 190 may include a wireless network radio, ethernet port, or other wired interface for communicating via a packet-switched network, and for accessing device 100 using a network address.

Figure 2:
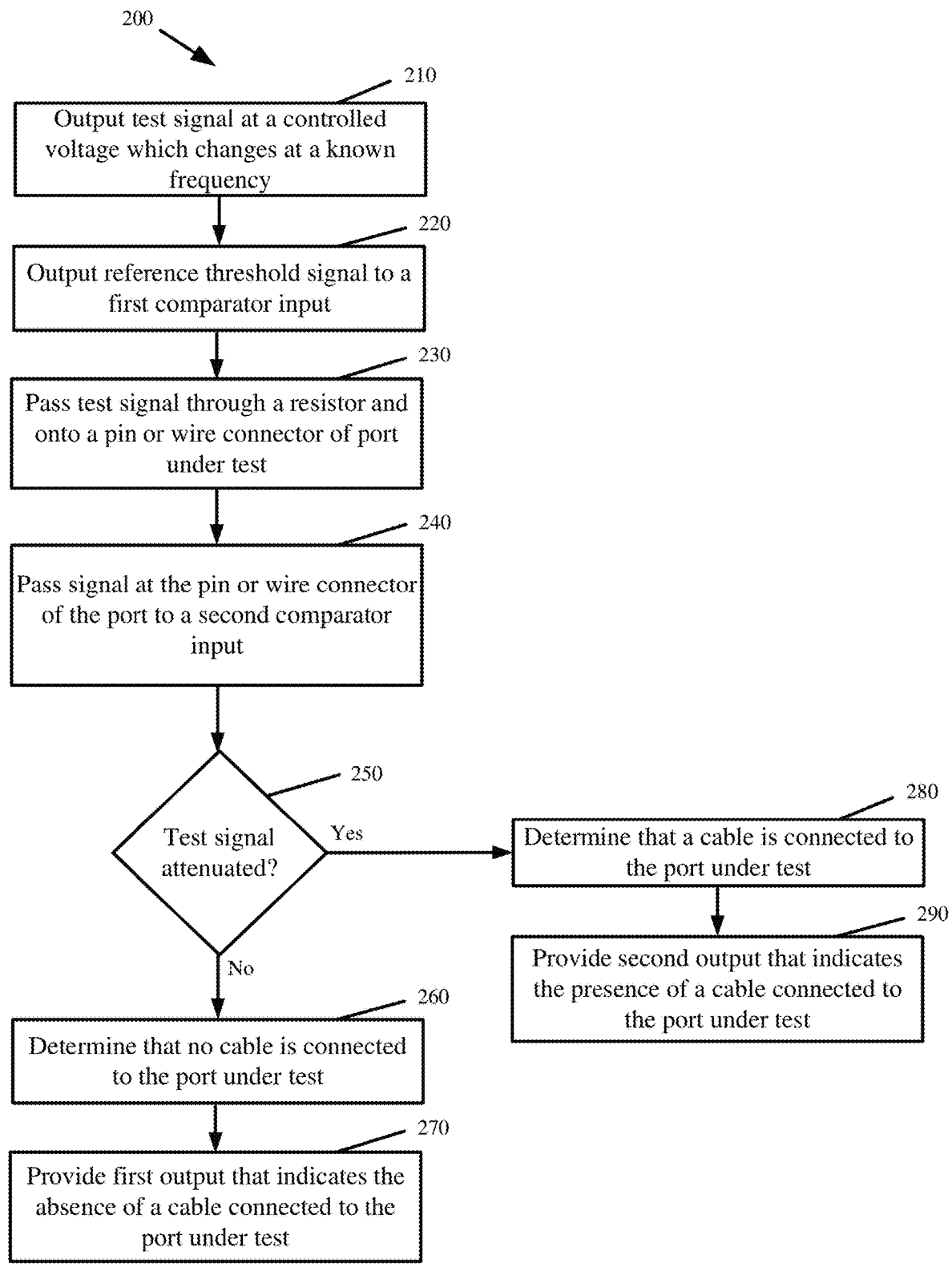
FIG. 2 presents a process for detecting, using the cable detection circuitry, the presence or absence of a cable at a port based on cable capacitance in accordance with some embodiments presented herein.

FIG. 2 presents a process 200 for detecting the presence or absence of a cable at port 130 based on cable capacitance in accordance with some embodiments presented herein. Process 200 may be performed using microcontroller 110 and circuit 120.

Process 200 may include outputting (at 210) a test signal from test signal output 160 of microcontroller 110. Microcontroller 110 may control the test signal by producing a controlled voltage which changes at a known frequency.

Process 200 may also include outputting (at 220) one or more reference threshold signals from microcontroller 110 to the first input of comparator 150. In some embodiments, microcontroller 110 may output the reference threshold signals at the same or different voltages than the test signal.

Process 200 may include passing (at 230) the test signal through resistor 140 and onto a pin or wire connector of port 130, and passing (at 240) the resulting signal at the pin or wire connector to the second input of comparator 150. Comparator 150 may detect any change to the test signal at the pin or wire connector. Specifically, process 200 may include determining (at 250), via comparator 150, if the test signal is attenuated or otherwise altered at the pin or wire connector by comparing the voltage of the reference threshold signal, that is output (at 220) from microcontroller 110, and the resulting signal, that is detected on the pin or wire connector of port 130. For instance, comparator 150 may be used to derive a first count for the number of times the resulting signal crosses the reference threshold signal over a period of time. The first count may be compared to a second count for the number of cycles in the test signal over the same period of time. By comparing the first count to the second count, microcontroller 110 may determine if the test signal was attenuated or otherwise altered due to the capacitance of a connected cable or wire.

When no cable is connected to port 130, the test signal is not attenuated (at 250—No) or otherwise affected, and the resulting signal at the pin or wire connector of port 130 matches the test signal. In this instance, comparator 150 would identify that the peak voltage of the resulting signal is greater than the voltage of the reference threshold signal, and/or that the first count matches the second count.

When a cable is connected to port 130 and a wire of the cable connects to the pin or wire connector of port 130, the test signal is attenuated (at 250—Yes) based on the capacitance of the cable. A cable with two or more wires will have capacitance, also known as parasitic capacitance, because the wires are electrical conductors that are near one another and have different voltages when the test signal is passed through one of a pair of wires in the cable. The length of the cable is one factor that affects the amount of cable capacitance and the amount of test signal attenuation. Specifically, the longer the length of the cable, the greater the capacitance of the cable, and the greater the attenuation of the test signal.

It should be noted that comparator 150 can detect the change in the test signal strictly based on a cable being connected or not being connected to port 130. In other words, comparator 150 can detect the change in the test signal without the other end of the cable being connected to another device, or with the other end of the cable being connected to an open switch or another device that is powered off and that does not provide any signaling from the other end of the cable.

In response to determining (at 250—No) that the test signal is not attenuated (e.g., the resulting signal has a peak voltage greater than the reference threshold signal and/or that the first count matches the second count), process 200 may include determining (at 260) that no cable is connected to port 130, and process 200 may include providing (at 270) first output that indicates the absence of a cable connected to port 130. The first output may be generated by microcontroller 110, and may be transmitted to a device of a remote system administrator, installer, or other user via the wired or wireless connectivity of device 100. Alternatively, device 100 may include lights, a display, or other means of outputting the connectivity status to users that are physically adjacent to device 100.

In response to determining (at 250—Yes) that the resulting signal is attenuated (e.g., the resulting signal has a lower peak voltage than the reference threshold signal and/or the first count is different than the second count), process 200 may including determining (at 280) that a cable is connected to port 130, and process 200 may include providing (at 290) different second output that indicates the presence of a cable connected to port 130. Here again, the second output may be transmitted to a device of a system administrator, installer, or other user that is at a remote location and away from device 100 so that the connectivity status of port 130 can be remotely tracked, or device 100 may provide different output via lights, a display, or other means of outputting the connectivity status.

In some embodiments, microcontroller 110 may adjust the reference threshold signal in response to determining (at 250) that the resulting signal has a lower peak voltage than the reference threshold signal. In particular, microcontroller 110 may adjust the voltage of the reference threshold signal until comparator 150 output indicates that the voltage of the reference threshold signal is approximately equal to the peak voltage of the resulting signal.

By adjusting the reference threshold signal, device 100 may not only detect that a cable is connected to port 130, but may measure the capacitance of the connected cable. Device 100 may then derive additional diagnostic data from the measured capacitance. For instance, device 100 may approximate the length of a connected cable based on the capacitance, and from the approximate length, may determine whether a correct or expected cable is connected to port 130. As a specific example, the detected capacitance may indicate that a cable 20 feet in length is connected to port 130, but the system may be designed for port 130 to connect to a device that is 150 feet away from device 100 such that the detected capacitance indicates that the wrong cable is connected to port 130.

Moreover, if port 130 has multiple pins, each pin may be independently tested to determine if a wire is connected to that pin. From the attenuation that is detected at two or more pins of port 130, device 100 may determine if a correct cable is connected to port 130 or if the connector at port 130 is correctly wired or connected. For instance, device 100 may detect test signal attenuation on a first set of pins and not a second set of pins of port 130. These results may indicate improper wiring as the same amount of attenuation is expected on the first and second sets of pins when port 130 is correctly wired or connected.

Figure 3:
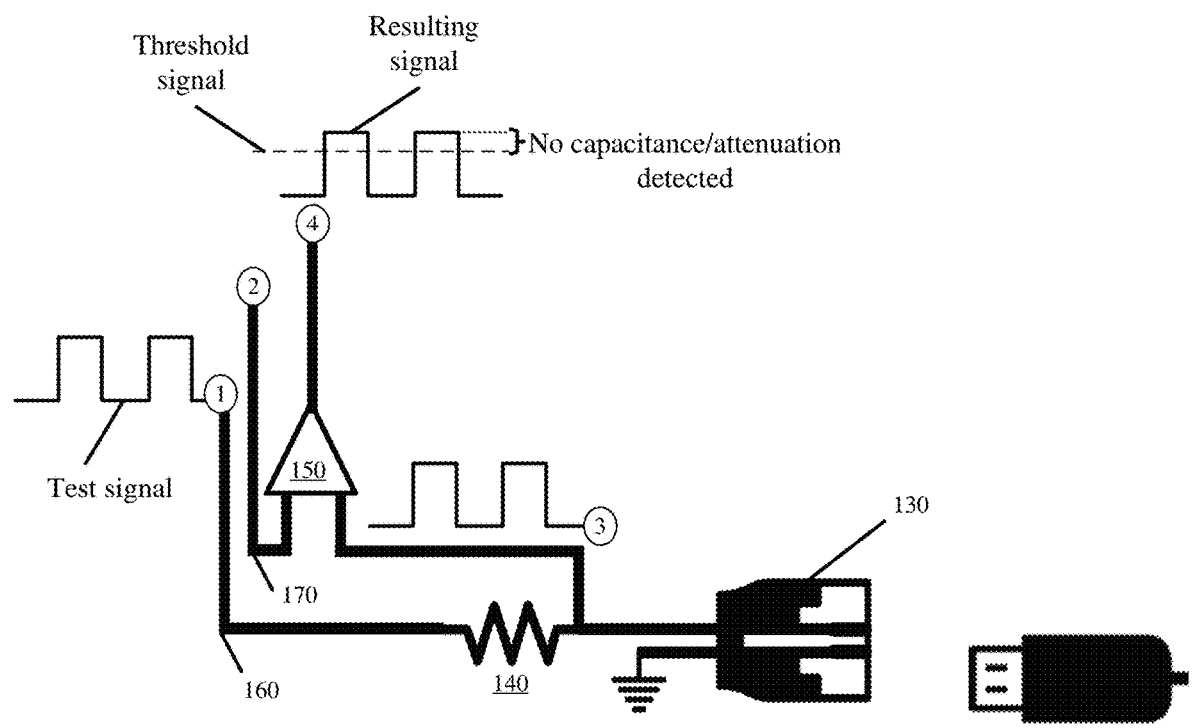
FIG. 3 illustrates example operation of the cable detection circuit with no cable connected to a port in accordance with some embodiments presented herein.

FIG. 3 illustrates example operation of circuit 120 with no cable connected to port 130 in accordance with some embodiments presented herein. In FIG. 3, no cable is inserted into port 130 and no external wires are connected to pins or wire connectors of port 130 prior to activating or using circuit 120 to detect the presence or absence of a cable at port 130.

As shown, test signal output 160 from microcontroller 110 provides (at 1) a test signal at a controlled voltage with a known frequency. The test signal passes through resistor 140 to a particular pin or wire connector of port 130. Comparator 150 receives (at 2) one or more reference threshold signals as a first input from microcontroller 110 via reference threshold signal output 170, and receives (at 3) the resulting signal on the particular pin or wire connector of port 130 as a second input.

In this example, the test signal is not attenuated and the resulting signal matches the test signal because there is no capacitor (e.g., cable) connected to port 130 that draws current from the test signal. Accordingly, comparator 150 may produce (at 4) output to indicate that the resulting signal has a greater peak voltage than the reference threshold signal and/or that the number of times the resulting signal crosses the reference threshold signal over a period of time is equal or similar to the number of cycles in the test signal over the same period of time. Based on this output, circuit 120 detects that there is no attenuation, and therefore no cable is connected to port 130. The output of circuit 120 may be provided to microcontroller 110, and microcontroller 110 may notify a remote device as to the port status, and/or may provide status notification using lights or a display of device 100.

Figure 4:
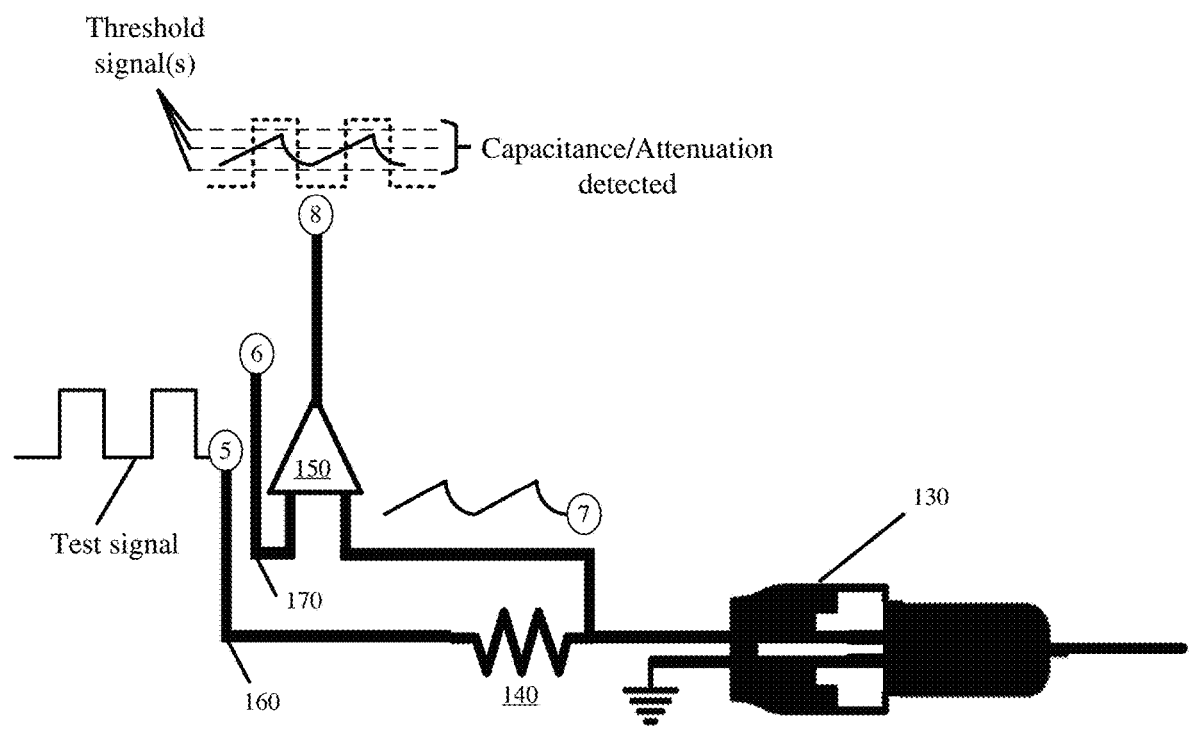
FIG. 4 illustrates example operation of the cable detection circuit with a cable connected to a port in accordance with some embodiments presented herein.

FIG. 4 illustrates example operation of circuit 120 with a cable connected to port 130 in accordance with some embodiments presented herein. In FIG. 4, a cable is inserted into port 130 with wires of the cable connecting to pins or wire connectors of port 130 prior to activating or using circuit 120 to detect the presence or absence of the cable at port 130.

As in FIG. 3, test signal output 160 from microcontroller 110 provides (at 5) the test signal with a controlled voltage and a known frequency. The test signal passes through resistor 140 to the particular pin or wire connector of port 130. Comparator 150 again receives (at 6) one or more reference threshold signals as a first input from microcontroller 110, and receives (at 7) the resulting signal on the particular pin or wire connector of port 130 as a second input.

In this example, the wires of the connected cable create a capacitor that draws current from the test signal based on the cable wires charging and discharging at the corresponding frequency of the test signal. The capacitance of the connected cable attenuates the test signal such that the resulting signal passing to the second input of comparator 150 has a reduced voltage (e.g., a lower peak voltage). Specifically, the capacitance between the individual wires of the cable becomes charged by the voltage of the test signal. Since it takes a certain amount of time for the cable to reach its charged level, this slows down and alters the test signal, and creates (at 7) the resulting signal at the particular pin or wire connector of port 130 that differs from the test signal. The resulting signal may resemble the attenuated or reduced voltage saw-tooth transitions depicted (at 7) in FIG. 4, because the cable, because of its capacitance, slows down the test signal voltage transitions, that are represented in the figures by square waves with near-vertical rise and fall transitions.

Using one or more different reference threshold signals, comparator 150 may detect that the resulting signal has a peak voltage that is less than the test signal, that is greater than if no test signal was applied to the particular pin or wire connector, and/or that is greater than any noise or interference on the particular pin or wire connector. Consequently, comparator 150 may produce (at 8) output that identifies capacitance attenuating or otherwise altering the test signal, and that further indicates a cable is connected to port 130. In some embodiments, microcontroller 110 is programmed to detect the presence or absence of a cable connected to port 140 based on the output of comparator 150. Microcontroller 110 can then notify a remote device as to the port status, or change one or more lights or a display to provide the port status on device 100.

Figure 5:
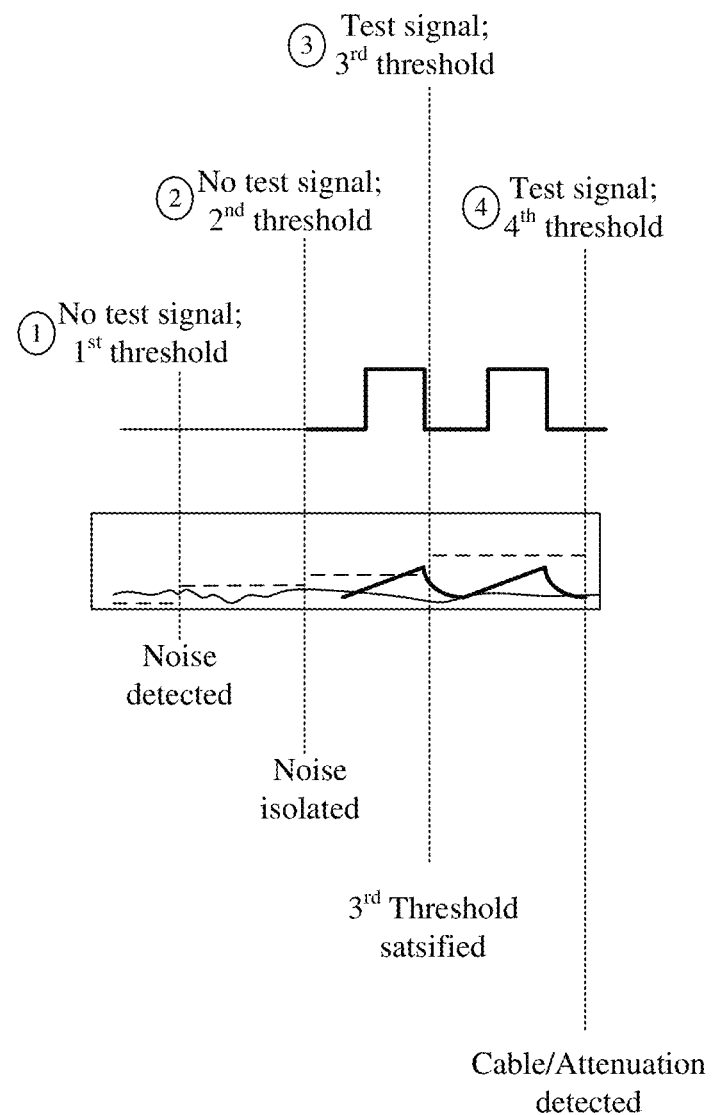
FIG. 5 illustrates an example of using different reference threshold signals and the cable detection circuit to provide status of a port with additional diagnostics in accordance with some embodiments presented herein.

In addition to using the different reference threshold signals to detect whether a cable is connected to port 130, microcontroller 110 may use the different reference threshold signals and circuit 120 to perform other diagnostics of port 130 and/or a cable connected to port 130. FIG. 5 illustrates an example of using different reference threshold signals and circuit 120 to provide status of port 130 with additional diagnostics in accordance with some embodiments presented herein. In particular, FIG. 5 illustrates using four different reference threshold signals that increase in voltage to determine the status of port 130 based on any capacitance at port 130.

During a first period of time, microcontroller 110 may output (at 1) no test signal, and may output (at 1) a first reference threshold at a first low voltage. Comparator 150 may detect that the resulting signal at port 130 has a peak voltage greater than the first reference threshold. Since no test signal is provided to port 130 during the first period of time, microcontroller 110 may detect noise (e.g., electrical interference at port 130), or may detect a signal that is placed on an opposite end of a cable that is connected to port 130.

To further diagnose port 130, microcontroller 110 may switch (at 2) from the first reference threshold signal to a second reference threshold signal during a second period of time. The second reference threshold signal may have a greater voltage than the first reference threshold signal. Microcontroller 110 may still not provide (at 2) a test signal during the second period of time in order to isolate the cause of the resulting signal that exceeded the first reference threshold signal. During the second period of time, comparator 150 may detect that the second reference threshold signal has a voltage that is greater than the peak voltage of the resulting signal at port 130. Accordingly, microcontroller 110 may determine that the resulting signal may be due to noise or electrical interference.

In some embodiments, circuit 120 may include one or more circuit elements that filter and/or amplify the resulting signal before the resulting signal passes to the second input of comparator 150. These circuit elements could be set to pass only signals matching the frequency of the test signal so as to remove noise from the resulting signal.

Upon isolating the noise, microcontroller 110 may output (at 3) a third reference threshold signal, that has a greater voltage than the second reference threshold signal, and may output (at 3) a test signal over a third period of time. During the third period of time, comparator 150 may detect that the resulting signal at port 130 has a greater peak voltage than the third reference threshold signal, which indicates that there is insufficient capacitance to attenuate the test signal below the third reference threshold signal. The comparator output at the third time may not conclusively indicate whether a cable is or is not connected to port 130.

During a fourth period of time, microcontroller 110 may continue to output (at 4) the test signal, and may output (at 4) a fourth reference threshold signal, that has a greater voltage than the third reference threshold signal and that may be closer to but less than the peak voltage of the test signal. During the fourth period of time, comparator 150 may provide output indicating that the fourth threshold signal has a greater voltage than the peak voltage of the resulting signal at port 130, which is indicative of the test signal being attenuated or otherwise altered at port 130. Specifically, the attenuation of the test signal at port 130 indicates that there is some capacitance drawing current from the test signal at port 130, and that the capacitance can be attributed to a cable that is connected to port 130. In FIG. 5, microcontroller 110 may use the outputs from comparator 150 to determine that a cable is connected to port 130, may determine an amount of noise present at port 130 or over the connected cable, and may provide these and other diagnostic or status information about port 130 and/or other monitored ports to another remote device or remote user that monitors the connectivity of device 100 without being physically located next to device 100.

Microcontroller 110 may use additional reference threshold signals to derive additional diagnostics. For instance, microcontroller 110 may continue to output the test signal, and may output a fifth reference threshold signal that has a voltage less than the fourth reference threshold signal but greater than the third reference threshold signal. Microcontroller 110 may use the fifth reference threshold signal and other adjusted reference threshold signals to not only determine that there is capacitance, but to measure the capacitance of the connected cable. From the measured amount of capacitance, microcontroller 110 may estimate the length or other properties of the connected cable.

Figure 6:
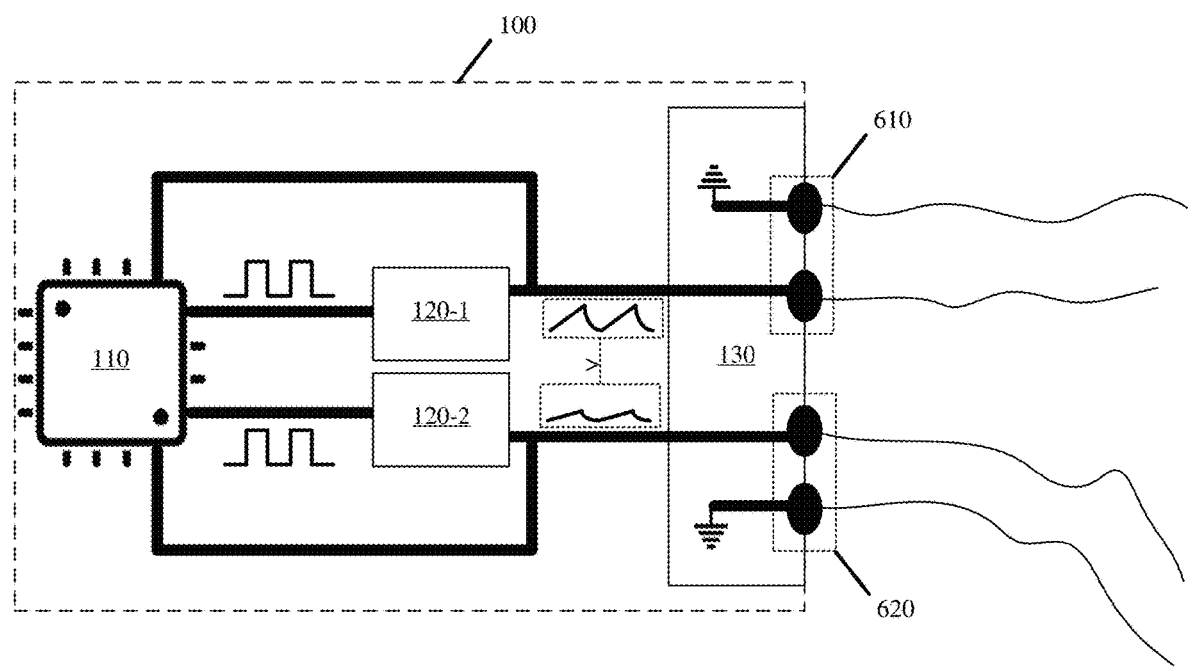
FIG. 6 illustrates example operation of a microcontroller and circuit to detect capacitance at different pins or wire connectors of a port in order to determine if the port is properly wired in accordance with some embodiments presented herein.

In some embodiments, the connected cable capacitance may be used to determine if port 130 has been wired or configured correctly. FIG. 6 illustrates example operation of microcontroller 110 and circuit 120 to detect capacitance at different pins or wire connectors of port 130 in order to determine if port 130 is properly wired in accordance with some embodiments presented herein.

As shown in FIG. 6, port 130 may be an interface with two pairs of wire connectors 610 and 620. Each pair of wire connectors 610 and 620 may be used for data communications with a single device when four wires are needed to communicate with that device, or to supply power and communicate with that single device.

It should be noted that device 100 may have different ports with two or more sets of wire connectors that are directly next to one another without significant differentiation between the wire connectors of the different ports. Accordingly, it may difficult for an installer to differentiate between the wire connectors of different ports.

Microcontroller 110 may use different reference threshold signals to detect if the wires connected to wire connectors 610 and 620 have the same capacitance or test signal attenuation. Different capacitance or different test signal attenuation may indicate that the wire connectors are improperly connected to wires of different devices instead of the same device, or that a particular pair of wires is connected to different wire connectors 610 and 620 instead of one set of wire connectors 610 or 620.

As shown in FIG. 6, microcontroller 110 may provide the same test signal to first circuit 120-1 and second circuit 120-2. First circuit 120-1 may be used to detect test signal attenuation on wire connectors 610, and second circuit 120-2 may be used to detect test signal attenuation on wire connectors 620.

Microcontroller 110 may output different reference threshold signals to first circuit 120-1 and second circuit 120-2 to measure the capacitance and/or test signal attenuation on each set of wire connectors 610 and 620. For instance, microcontroller 110 may output a first reference threshold signal, and may determine that the resulting signal on wire connectors 610 and wire connectors 620 has a peak voltage that is greater than the first reference threshold signal. Microcontroller 110 may then output a different second reference threshold signal, and may determine that the resulting signal on first circuit 120-1 has a peak voltage that is less than the second reference threshold signal, but that the resulting signal on second circuit 120-2 has a peak voltage that is greater than the second reference threshold. Consequently, the resulting signal detected by each circuit 120-1 and 120-2 in response to the second reference threshold signal is different.

The difference indicates different capacitance attenuating the test signal at wire connectors 610 and 620, which may further indicate that wire connectors 610 and 620 are connected to different devices. Stated differently, if the same wires (e.g., wires of a common cable or wires of the same length and/or other properties) connect wire connectors 610 and 620 to a common device at a first location (e.g., a particular distance from device 100), then first circuit 120-1 and second circuit 120-2 should not detect any difference in the wire capacitance or test signal attenuation at wire connector 610 and wire connector 620 when provided different reference threshold signals by microcontroller 110. However, if different wires (e.g., wires of different cables or wires of different lengths and/or other properties) connect wire connectors 610 and 620 to different devices at two different locations (e.g., two different distances from device 100), then first circuit 120-1 and second circuit 120-2 would detect differences in the wire capacitance or test signal attenuation at wire connector 610 and wire connector 620 when provided different reference threshold signals by microcontroller 110 as shown in FIG. 6.

In response to detecting the different capacitance and/or test signal attenuation at wire connectors 610 and 620 using microcontroller 110 and output from circuits 120-1 and 120-2, device 100 may provide a message that notifies an installer or remote device that pins or wire connectors of port 130 are misconfigured or incorrectly connected. For instance, device 100 may send a message over a wired or wireless network to a system controller to identify the issue. Alternatively, device 100 may illuminate one or more status lights or a display to identify the error at port 130 to a nearby installer.

Some embodiments may modify the cable detection circuitry to detect the presence or absence of a cable at a port of device 100, that may or may not be connected at an opposite end, via alternative capacitance measurements. For instance, rather than apply a test signal at a specific frequency, the cable detection circuitry may apply a voltage to resistor 140, and may measure the resulting signal at one or more points in time using an analog-to-digital converter ("ADC") to detect capacitance from a connected cable or absence of a connected cable.

Figure 7:
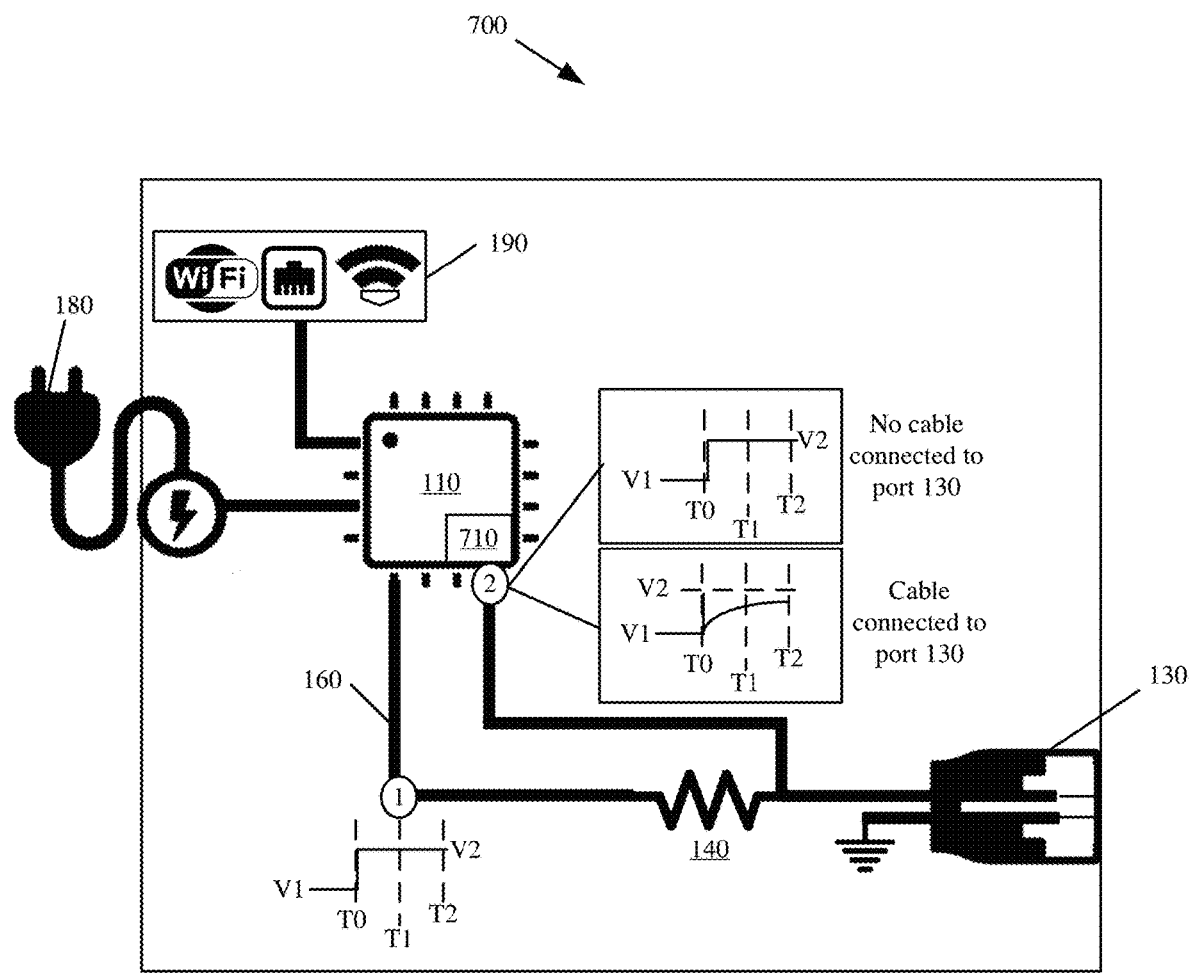
FIG. 7 illustrates example device 700 using an analog-to-digital converter ("ADC") to detect capacitance in accordance with some embodiments presented herein.

FIG. 7 illustrates example device 700 using ADC 710 to detect capacitance in accordance with some embodiments presented herein. As shown in FIG. 7, test signal output 160 of microcontroller 110 is connected to resistor 140, and to a particular pin or wire connector of port 130. The particular pin or wire connector may also connect to ADC 710 in order to provide the resulting signal from the particular pin or wire connector of port 130 to ADC 710.

In some embodiments, ADC 710 may be an internal component of microcontroller 110, and this internal component may be used as part of the cable detection circuitry without introducing additional circuit elements to device 700. In some other embodiments, ADC 710 may be an external component that provides output to microcontroller 110.

Microcontroller 110 may output (at 1) a test signal on test signal output 160 that transitions from a first voltage to a second voltage at a first time (e.g., transitions from 0 volts to 5 volts). ADC 710 may measure (at 2) the voltage of the resulting signal that results from the test signal at the particular pin or wire connector of port 130 at different times (e.g., at a second time and a third time after the first time).

Capacitance from a cable or wire connected to port 130 may delay or slow down the change in the measured voltage of the resulting signal, whereas the resulting signal voltage may almost instantaneously reach the test signal voltage when there is no cable or wire connected to port 130. The measurements taken (at 2) by ADC 710 at a second time and a third time, after transitioning the voltage of the test signal, detect the rate at which the change in the resulting signal occurs.

In some embodiments, output from ADC 710 (e.g., voltage measurements) may be passed to microcontroller 110, and microcontroller 110 may contain logic to detect the presence or absence of a connected cable at port 130 based on the output from ADC 710. For instance, microcontroller 110 may determine that no cable is connected to port 130 when the measurement taken at the second time is greater than a predetermined fraction of the test signal. Similarly, ADC 710 may determine that a cable is connected to port 130 when the measurement taken at the second time and/or the third time is less than a predetermined fraction of the test signal voltage.

ADC 710 and/or microcontroller 100 may also derive additional diagnostic information from the measurements taken at the second time, third time, and/or other later times. For instance, the capacitance of a connected cable may be determined based on the time of the measurement and the voltage of the test signal. Based on the capacitance measurement, microcontroller 110 may compute the length of the connected cable.

Figure 8:
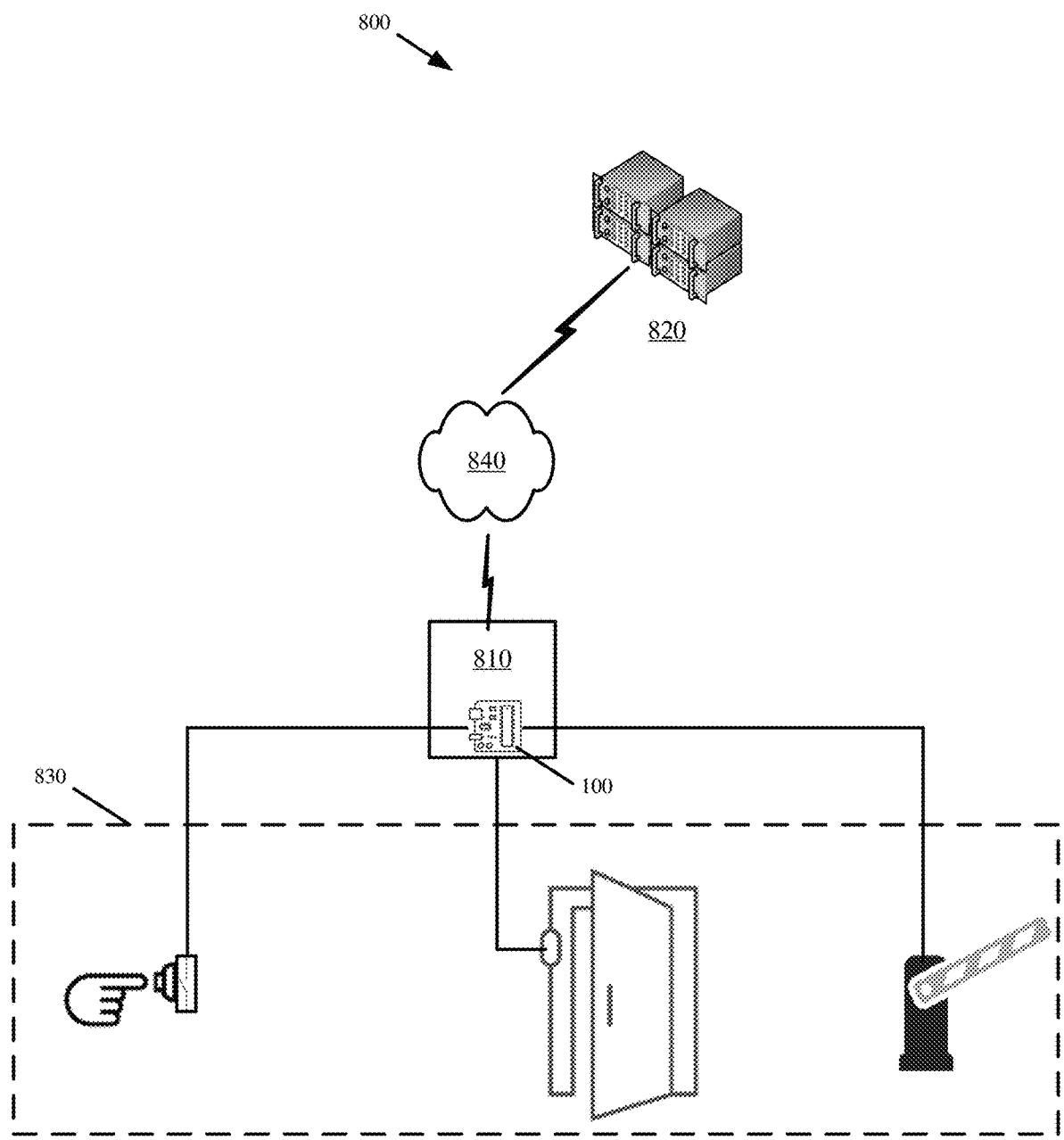
FIG. 8 illustrates an example environment in which one or more embodiments, described herein, may be implemented.

FIG. 8 illustrates an example environment 800 in which one or more embodiments, described herein, may be implemented. As shown in FIG. 8, environment 800 may include ACU 810, system controller 820, connected devices 830, and network 840.

The quantity of devices, components, and/or networks, illustrated in FIG. 8, is provided for explanatory purposes only. In practice, environment 800 may include additional devices, components, and/or networks; fewer devices, components, and/or networks; different devices, components, and/or networks; or differently arranged devices, components, and/or networks than illustrated in FIG. 8. For instance, ACU 810 may have six ports that allow ACU 810 to connect to six different connected devices 830.

One or more of the devices of environment 800 may perform one or more functions described as being performed by another one or more of the devices of environment 800. For instance, device 100 or device 700 may be a circuit board or other component integrated as part of ACU 810 and/or one or more of connected devices 830. Alternatively, functionality of ACU 810 may be integrated as part of functionality of system controller 820 and vice versa.

In some embodiments, ACU 810 may be a device that authorizes user access to different secured resources. ACU 810 may store access privileges, and may receive access requests over network 840 or directly via wired connectivity to connected devices 830. ACU 810 may provide access signaling to the secured resources and/or connected devices 830 in order to change state of these resources and/or connected devices 830 by unlocking or locking access, opening or closing access, or otherwise granting or restricting access.

ACU 810 may be located remote from resources and devices under its control. However, ACU 810 may be directly wired to the resources and devices via different ports of ACU 810 and long cable runs.

As shown in FIG. 8, ACU 810 may include device 100 and/or device 700 to monitor connectivity and to perform other diagnostics on one or more ports of ACU 810. It should be noted that device 100 or device 700 is not limited to being used with ACU 810, and can be integrated with any device or machine that has one or more wired ports or interfaces, and where remote monitoring of port status may be desired, especially when the ports or interfaces may be connected to open switches, devices that are powered off, or other devices that do not provide signaling over a connected cable or wire.

ACU 810 may use network 840 to communicate with system controller 820. System controller 820 may include one or more cloud-based machines or machines that are located at a different site than ACU 810, and that may be used to administer, configure, monitor, or otherwise communicate with ACU 810 remotely. For instance, system controller 820 may be used to remotely configure ACUs 810 at different locations by providing user privilege information, secured resource information, and/or other configuration data to the ACUs 810. In some embodiments, system controller 820 may receive and forward access request messaging from user devices to the ACU 810. In some embodiments, system controller 820 may supplement ACU 810. In some such embodiments, system controller 820 may receive the access request messaging, may authorize user or user device access to a secured resource on behalf of or in place of ACU 810, and/or may provide authorized users with access to different secured resources by directly controlling or signaling secured resources. System controller 820 may be accessed via an Internet Protocol ("IP") address or another network address using any Internet-enabled device.

Network 840 may include different wired and wireless networks that a network-enabled device may use to reach any Internet-accessible device including ACU 810 and/or system controller 820. Network 840 may include WiFi, Long Term Evolution, Fifth Generation, any wireless telecommunications network, Internet Protocol-based packet data networks ("PDNs"), and/or wide area networks ("WANs") such as the Internet.

Connected devices 830 may include devices, sensors, circuits, and/or other system components that are directly wired to different ports of ACU 810. Each connected device 830 may be connected to a specific port of ACU 810 based on wiring specifications of that connected device 830 and port of ACU 810. For instance, some devices 830 may use an eight pin RJ45 connector to connect to an ethernet port of ACU 810, and other devices 830 may use a single twisted pair of wires to connect to a different port of ACU 810. ACU 810 may control, configure, monitor, or otherwise communicate and exchange data with connected devices 830 via the cabling or wiring connecting ACU 810 to connected device 830. Some of the connected devices 830 may operate in default or normal open switch mode, and others may be controlled by ACU 810 and may not provide signaling to ACU 810 as a result.

Connected devices 830 may control access to secured devices. Accordingly, connected devices 830 may include electronically controlled locks, wireless readers, contact sensors, motion detectors, and touch sensors as some examples. Connected devices 830 may also include secured resources. The secured resources may include any physical or digital asset that can be remotely locked and unlocked, closed and opened, or otherwise made inaccessible and accessible. In some embodiments, the secured resources may include doors, windows, gates, or other physical barriers with a controllable locking or closing mechanism. In some embodiments, secured resources may be a computer, vehicle, or other system with restricted access.

Figure 9:
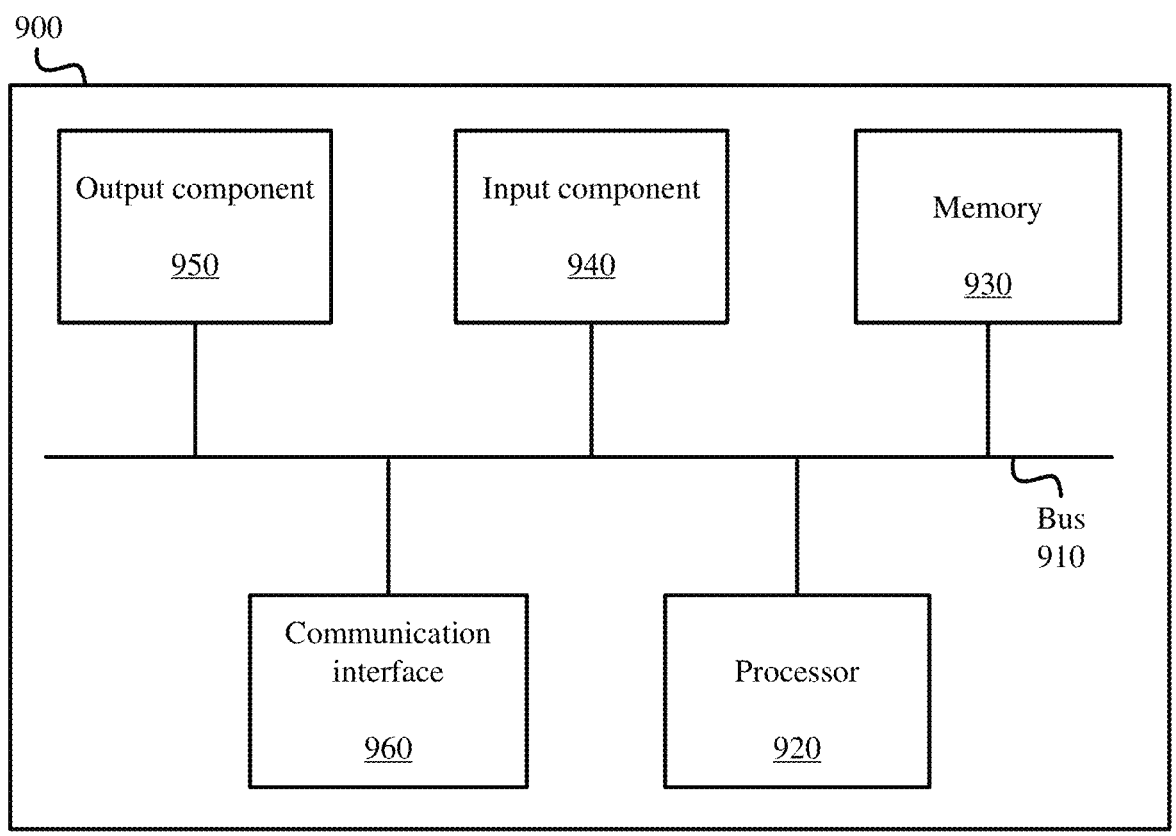
FIG. 9 illustrates example components of one or more devices, according to one or more embodiments described herein.

FIG. 9 is a diagram of example components of device 900. Device 900 may include additional components of the cable detection circuit (e.g., device 100, device 700, etc.), ACU 810 integrated with the cable detection circuit, and/or other components of a device that is integrated with the cable detection circuit. Device 900 may include bus 910, processor 920, memory 930, input component 940, output component 950, and communication interface 960. In another implementation, device 900 may include additional, fewer, different, or differently arranged components.

Bus 910 may include one or more communication paths that permit communication among the components of device 900. Processor 920 may include a processor, microprocessor, or processing logic that may interpret and execute instructions. Memory 930 may include any type of dynamic storage device that may store information and instructions for execution by processor 920, and/or any type of non-volatile storage device that may store information for use by processor 920.

Input component 940 may include a mechanism that permits an operator to input information to device 900, such as a keyboard, a keypad, a button, a switch, etc. Output component 950 may include a mechanism that outputs information to the operator, such as a display, a speaker, one or more light emitting diodes ("LEDs"), etc.

Communication interface 960 may include any transceiver-like mechanism that enables device 900 to communicate with other devices and/or systems. For example, communication interface 960 may include an Ethernet interface, an optical interface, a coaxial interface, or the like. Communication interface 960 may include a wireless communication device, such as an infrared ("IR") receiver, a Bluetooth® radio, or the like. The wireless communication device may be coupled to an external device, such as a remote control, a wireless keyboard, a mobile telephone, etc. In some embodiments, device 900 may include more than one communication interface 960. For instance, device 900 may include an optical interface and an Ethernet interface.

Device 900 may perform certain operations relating to one or more processes described above. Device 900 may perform these operations in response to processor 920 executing software instructions stored in a computer-readable medium, such as memory 930. A computer-readable medium may be defined as a non-transitory memory device. A memory device may include space within a single physical memory device or spread across multiple physical memory devices. The software instructions may be read into memory 930 from another computer-readable medium or from another device. The software instructions stored in memory 930 may cause processor 920 to perform processes described herein. Alternatively, hardwired circuitry may be used in place of or in combination with software instructions to implement processes described herein. Thus, implementations described herein are not limited to any specific combination of hardware circuitry and software.

The foregoing description of implementations provides illustration and description, but is not intended to be exhaustive or to limit the possible implementations to the precise form disclosed. Modifications and variations are possible in light of the above disclosure or may be acquired from practice of the implementations.

The actual software code or specialized control hardware used to implement an embodiment is not limiting of the embodiment. Thus, the operation and behavior of the embodiment has been described without reference to the specific software code, it being understood that software and control hardware may be designed based on the description herein.

Some implementations described herein may be described in conjunction with thresholds. The term "greater than" (or similar terms), as used herein to describe a relationship of a value to a threshold, may be used interchangeably with the term "greater than or equal to" (or similar terms). Similarly, the term "less than" (or similar terms), as used herein to describe a relationship of a value to a threshold, may be used interchangeably with the term "less than or equal to" (or similar terms). As used herein, "exceeding" a threshold (or similar terms) may be used interchangeably with "being greater than a threshold," "being greater than or equal to a threshold," "being less than a threshold," "being less than or equal to a threshold," or other similar terms, depending on the context in which the threshold is used.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. A device comprising:
    a wire connector;
    a detection circuit comprising a resistor, a comparator, and wiring connecting the resistor to the wire connector and to a first input of the comparator; and
    a microcontroller configured to:
        provide a test signal at a particular voltage to the resistor and a plurality of reference threshold signals at different voltages to a second input of the comparator;
        detect a wire connected to the wire connector based on the comparator outputting a signal indicating voltage of a particular reference threshold signal at the second input is greater than voltage of a resulting signal at the first input as a result of capacitance of the wire attenuating the test signal; and
        determine capacitance of the wire based on the comparator outputting signals indicating voltage of the resulting signal is greater than voltages of a first set of the plurality of reference threshold signals, and signals indicating voltage of the resulting signal is less than voltages of a different second set of the plurality of reference threshold signals.

2. The device of claim 1,
    wherein the wire connector is a pin at a port of the device; and
    wherein the pin provides signaling to a different second device via cabling connected to the port and the second device.

3. The device of claim 1,
    wherein the comparator generates a first output based on a reference threshold signal at the second input and the resulting signal at the first input matching the test signal in response to the wire connector not being connected to a wire; and
    wherein the comparator generates a different second output based on a reference threshold signal at the second input and the resulting signal at the first input not matching the test signal in response to the wire connector being connected to a wire of a certain length.

4. The device of claim 1,
    wherein the comparator detects no wiring connected to the wire connector based on an absence of capacitance at the wire connector, wherein the absence of capacitance at the wire connector results in the test signal passing from the resistor to the wire connector and the first input without attenuation; and
    wherein the comparator detects wiring connected to the wire connector based on capacitance at the wire connector as a result of the wiring being connected to the wire connector, wherein the capacitance at the wire connector attenuates the test signal that passes from the resistor to the first input.

5. The device of claim 1, wherein the microcontroller is further configured to:
    detect absence of a wire connected to the wire connector based on the comparator outputting a signal indicating that the resulting signal at the first input matches the test signal by having a peak voltage that is greater than the voltage of a reference threshold signal.

6. The device of claim 1, wherein the microcontroller is further configured to:

compute a length of the wire connected to the wire connector based on the capacitance; and verify connection of a correct wire to the wire connector based on the length.

7. The device of claim 1 further comprising:
a network interface providing connectivity status of the wire connector to a remote second device via messaging generated by the microcontroller based on output of the comparator.

8. The device of claim 1 further comprising:
a light or display presenting connectivity status of the wire connector, wherein the light or display is controlled by the microcontroller based on output of the comparator.

9. A device comprising:
a plurality of ports, each port of the plurality of ports comprising an interface for connecting to a cable with one or more wires;
a detection circuit that receives a resulting signal from at least a particular port of the plurality of ports;
a control module configured to:
output a test signal with a controlled voltage to the particular port at a particular time;
detect capacitance that attenuates the test signal at the particular port in response to output from the detection circuit indicating that voltage of the resulting signal does not match the controlled voltage of the test signal;
produce a plurality of reference thresholds signals with different voltages; and
determine the capacitance at the particular port based on output from the detection circuit indicating that voltage of the resulting signal is greater than voltages of a first set of the plurality of reference threshold signals, and is less than voltages of a different second set of the plurality of reference threshold signals.

10. The device of claim 9, wherein the control module is further configured to:
detect absence of a cable connected to the particular port in response to output from the detection circuit indicating that the voltage of the resulting signal matches the controlled voltage of the test signal.

11. The device of claim 9, wherein the control module is further configured to:
output a particular reference threshold signal to the detection circuit at a voltage less than the controlled voltage of the test signal;
compare the voltage of the resulting signal against the voltage of the particular reference threshold signal; and
wherein the voltage of the resulting signal does not match the controlled voltage of the test signal when the voltage of the resulting signal is less than the voltage of the particular reference threshold signal.

12. The device of claim 9, wherein the control module is further configured to:
measure a first voltage of the resulting signal at a first time after the particular time;

measure a second voltage of the resulting signal at a second time after the first time; and
wherein the voltage of the resulting signal does not match the controlled voltage of the test signal when the second voltage is less than the first voltage.

13. The device of claim 9, wherein the control module is further configured to:
compute a length of a cable connected to the particular port based on the capacitance; and
verify connection of a correct wire to the wire connector based on the length.

14. The device of claim 9, wherein the detection circuit comprises:
a resistor;
a comparator; and
wiring connecting the resistor to the particular port and to a first input of the comparator.

15. The device of claim 9, wherein the detection circuit comprises:
a resistor;
an analog-to-digital ("ADC") converter, wherein the ADC measures voltage of the resulting signal at different times after outputting the test signal at the particular time, and wherein the voltage of the resulting signal does not match the controlled voltage of the test signal when one or more measurements of the resulting signal taken by the ADC are less than a predetermined fraction of the controlled voltage of the test signal; and
wiring connecting the resistor to the particular port and to the ADC.

16. The device of claim 9,
wherein the capacitance is provided by a cable that is connected to the particular port at a first end of the cable; and
wherein the cable does not receive signaling from an opposite second end.

17. A method comprising:
providing a detection circuit that receives a resulting signal from a cable connection port of a device;
outputting a test signal with a controlled voltage to the cable connection port;
detecting capacitance that attenuates the test signal at the cable connection port in response to output from the detection circuit indicating that voltage of the resulting signal does not match the controlled voltage of the test signal;
producing a plurality of reference thresholds signals with different voltages; and
determining the capacitance at the cable connection port based on output from the detection circuit indicating that voltage of the resulting signal is greater than voltages of a first set of the plurality of reference threshold signals, and is less than voltages of a different second set of the plurality of reference threshold signals.

* * * * *